United States Patent

Mironesco et al.

[11] Patent Number: 5,495,976
[45] Date of Patent: Mar. 5, 1996

[54] TILTED WEDGE BONDING TOOL

[75] Inventors: Dan Mironesco, Yokneam; Yoav Venkert, Haifa; Beni Nachon, Qiriat-Ata, all of Israel

[73] Assignee: Kulicke and Soffa Investments, Inc., Wilmington, Del.

[21] Appl. No.: 250,542

[22] Filed: May 27, 1994

[51] Int. Cl.[6] .................................................. B23K 20/10
[52] U.S. Cl. ...................... 228/110.1; 228/1.1; 228/175; 228/180.5
[58] Field of Search .................................. 228/1.1, 110.1, 228/4.5, 175, 180.5

[56] References Cited

U.S. PATENT DOCUMENTS

| 3,101,635 | 8/1963 | Kulicke, Jr. | 228/4.5 |
| 4,475,681 | 10/1984 | Ingle | 228/4.5 |

FOREIGN PATENT DOCUMENTS

| 3-22450 | 1/1991 | Japan | 228/1.1 |
| 5-74874 | 3/1993 | Japan | 228/110.1 |
| 575191 | 10/1977 | U.S.S.R. | 228/4.5 |

*Primary Examiner*—P. Austin Bradley
*Assistant Examiner*—Jeffrey T. Knapp
*Attorney, Agent, or Firm*—John B. Sowell

[57] ABSTRACT

A novel bonding tool is designed for use in conventional ultrasonic transducers. The bonding tool body is mounted in the ultrasonic transducer at an angle or in an offset holder so that the working face of the bonding tool is offset and out from under the end of the ultrasonic transducer. The axis of a wedge bonding tool body is mounted at an inclined angle of up to forty-five degrees and the tapered wedge of the bonding tool is inclined in the opposite direction so that the working face of the offset tapered wedge is in a horizontal working plane.

8 Claims, 2 Drawing Sheets

TILTED WEDGE BONDING TOOL

BACKGROUND OF THE INVENTION

1. Field of the Invention

The present invention relates to bonding tools or bonding wedges of the type used in manual or automatic wire and tab bonders to attach an electrical conductor to a target, pad or terminal on a substrate, a PC board or other type of component carrier. More particularly, the present invention relates to a novel thermosonic wedge bonding tool adapted to be clamped in an ultrasonic transducer at an inclined angle so that the working face of the bonding wedge is displaced laterally and out from under the ultrasonic transducer providing access to the bonding area.

2. Description of the Prior Art

Heretofore, bonding wedges were known. Early discrete semiconductors had their wires electrically connected to carriers employing bonding wedges before bonding capillaries were developed. Single point wedge bonding tools are still employed in some Tape Automated Bonding (TAB) applications in preference to gang bonding tools. In the mid-1960s wedge bonding tools incorporated into the tools an inclined funnel or wire feed which enabled wire bonders to make first and second bonds without losing the fine wire from the tool.

Heretofore, wedge bonding tools were manufactured with a working face on the bonding tool which was substantially orthogonal to the vertical axis of the tool when mounted in a transducer or other type of tool holder. This arrangement is known to obscure the line of sight of a pattern recognition system (PRS) which is employed to locate the position of a semiconductor device and the bonding pads located thereon. It is the present practice to locate the bonding targets on a semiconductor device while not obscured by the bonding tool and its holder prior to performing a bonding operation. When a subsequent operation is being performed on or at the bonding target area, it is necessary to remove the object being wire bonded from its work station and reposition the object at a second work station. Alternatively, the work station must be movable to a second of two predetermined positions. In either event a considerable amount of time is lost and the cost of special fixtures may be required to assure proper post wire bonding operations.

It would be desirable to provide a wedge bonding tool and tool holder which avoids the problems described above when attempting to perform a second operation at the same location where a wire bond is being or has just been made.

SUMMARY OF THE INVENTION

It is a primary object of the present invention to provide a wedge bonding tool which does not obscure vision or access to the area being bonded.

It is another primary object of the present invention to provide a bonding tool which will permit simultaneous operation of a PRS to locate pads or electrodes during bonding operations.

It is a primary object of the present invention to provide a wedge bonding tool for bonding an electrical conductor to a bonding target employing a bonding tool body or holder which is offset from the working face of the bonding tool.

It is a primary object of the present invention to provide a novel wedge bonding tool which is adapted to be mounted in a bonding tool holder at an inclined angle up to 45 degrees.

It is a primary object of the present invention to provide a novel bonding tool and bonding tool holder which permits viewing the bonding target during a bonding operation.

According to these and other objects of the present invention, there is provided a tilted wedge bonding tool which is connected to an ultrasonic transducer so that the working face of the bonding tool is offset and extends out from beneath the end of the ultrasonic transducer to provide physical and visual access to the area adjacent to the working face of the bonding tool.

DESCRIPTION OF THE PREFERRED EMBODIMENTS

Figure 1:
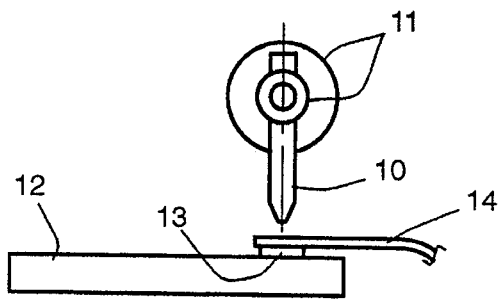
FIG. 1 is a front elevation of the prior art bonding wedge in an ultrasonic transducer positioned over a tab lead to be bonded.

Refer now to FIG. 1 showing a front elevation of a prior art bonding wedge 10 which is mounted in an ultrasonic transducer 11. The object 12 represents a substrate, chip or carrier having a bonding pad or target 13 to which an electrical conductor 14 is to be bonded by the ultrasonic bonding tool 10. It is usual to heat the substrate 12 while simultaneously applying pressure and ultrasonic energy through the bonding tool 10 to connect the electrical conductor in the form of fine wire, a coated wire or even a TAB lead to the bonding target 13.

Figure 2:
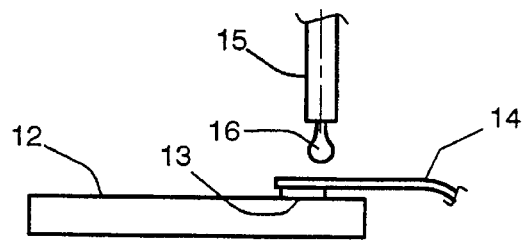
FIG. 2 is a front elevation of a prior art epoxy dispenser positioned over a tab lead to be encapsulated.

Refer now to FIG. 2 showing a front elevation of a prior art adhesive dispenser 15 which is positioned slightly off center from the bonding target 13 on the substrate 12 so that the drop of epoxy adhesive will permanently bond the electrical conductor to the substrate 12 as well as the target 13. Adhesive reinforcements are employed in the prior art to prevent electrical conductors 14 from either breaking or working loose from the bonding target 13 when the substrate 12 or the wire 14 is moved when operating in its intended environment such as a connection from a substrate supporting a movable bonding head.

Figure 3:
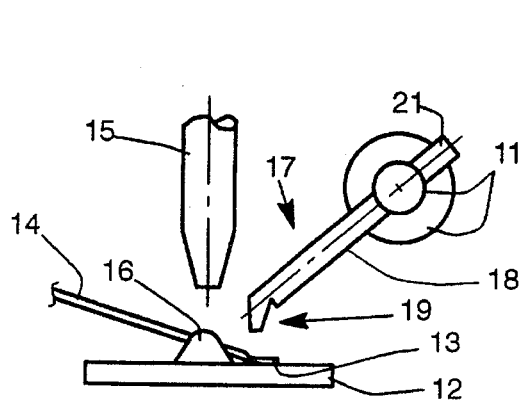
FIG. 3 is a schematic drawing in front elevation of the present invention bonding wedge and juxtaposed epoxy dispenser positioned over a single wire or lead.

Refer now to FIG. 3 showing a schematic drawing in front elevation of a preferred embodiment of the present invention bonding wedge which is shown juxtaposed an epoxy dispenser 15 positioned over a wire 14 so as to dispense a drop of epoxy adhesive which attaches the wire 14 to the substrate 12 at a position slightly removed from the bonding target 13. In the preferred embodiment of the present invention, the prior art transducer 11 may be employed to support the new novel bonding tool 17 which comprises an elongated body 18 and a tapered wedge 19 which is formed on the end of the bonding tool 17 opposite the clamping end 21. In the preferred embodiment of the present invention, the bonding operation is performed by the bonding tool 17 and the wire 14 is simultaneously being attached by a drop of adhesive 16 to the substrate 12. Since both operations are being performed at the same work station, there is no requirement that the bonding operation be performed at any particular time relative to the application of the drop of adhesive 16. It will be noted that the working face or tapered wedge 19 of the bonding tool is offset vertically from under the ultrasonic transducer 11 so as to provide access to the bonding pad area 13 by the dispenser 15.

Figure 4:
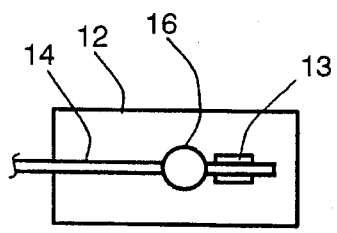
FIG. 4 is a schematic drawing in plan view of the FIG. 3 wire after being bonded and encapsulated.

Refer now to FIG. 4 showing a schematic plan view of the epoxy drop 16 connecting the wire 14 to the substrate 12 in the area adjacent to the bonding pad 13. It will be understood that the bonding tool 17 may be raised above the bonded wire 14 when the epoxy drop is dispensed from the dispenser 15 which permits the epoxy drop 16 to completely encapsulate part of the bonding target 13 as well as the wire 14 at its connection point.

Figure 5:
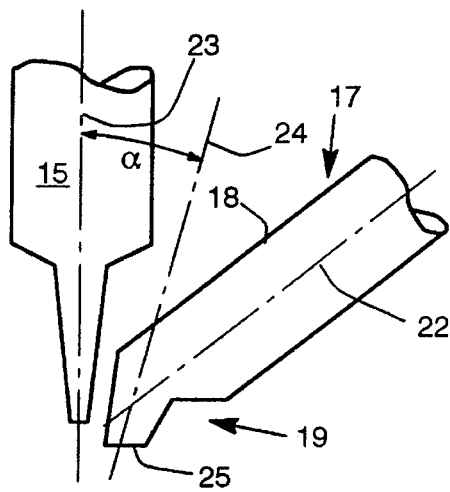
FIG. 5 is an enlarged schematic drawing in front elevation of the present invention bonding wedge and an epoxy dispenser mounted in close proximity thereto.

Refer now to FIG. 5 showing an enlarged schematic drawing in front elevation of the present invention bonding wedge 17 adjacent to the epoxy dispenser 15. The elongated body 18 of the bonding tool 17 is shown having an inclined axis 22 of approximately 45 degrees from the vertical axis 23. Further, the tapered wedge 19 of the bonding tool 17 is shown having an inclined axis 24 which differs only slightly from the vertical axis 23 by the angle alpha. By tilting the tapered wedge 19 at the slight angle alpha, additional access can be had for the dispensing point of the dispenser 15 which permits closer application of an adhesive which can flow under the raised working face 25 of the tapered wedge 19. In the preferred embodiment of the present invention, it has been found that inclined angles of the axis 22 up to approximately 45 degrees will provide sufficient vertical access to the bonding targets 13 while still maintaining a desired bonding force and ultrasonic energy to the wire and bonding targets shown in FIGS. 3 and 4.

Figure 6:
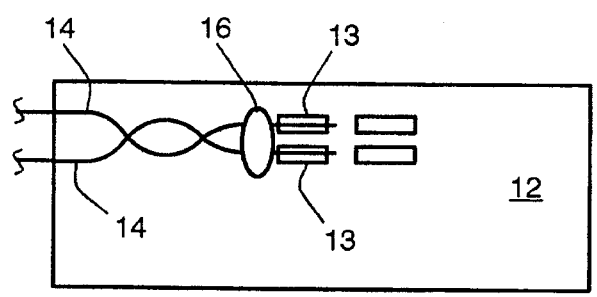
FIG. 6 is an enlarged schematic drawing in plan view showing a twisted pair of insulated wires after being bonded and encapsulated with an offset wedge bonding tool.

Refer now to FIG. 6 showing in an enlarged schematic drawing and plan view of a twisted pair of insulated or uninsulated wires 14 after being bonded and encapsulated with adhesive using the bonding wedge 17 and dispenser 15 shown in FIG. 5. In the preferred embodiment of the present invention, the bonding tool 17 is stepped to two positions to perform the bonding operation of the wire 14 to the bonding pads 13. In similar manner the epoxy drop 16 may be dropped from a single position to form the drop 16 or depending on how the dispenser 15 is supported can be moved to form an elongated epoxy drop while the substrate 12 is held at the bonding station.

Figure 7:
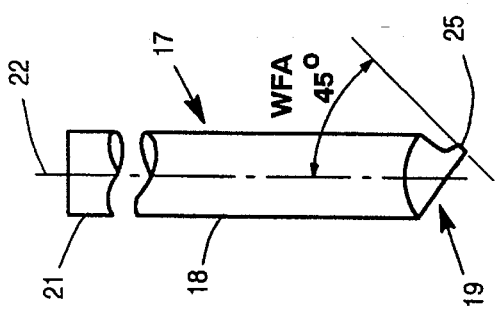
FIG. 7 is a front elevation of a present invention offset wedge bonding tool.
Figure 8:
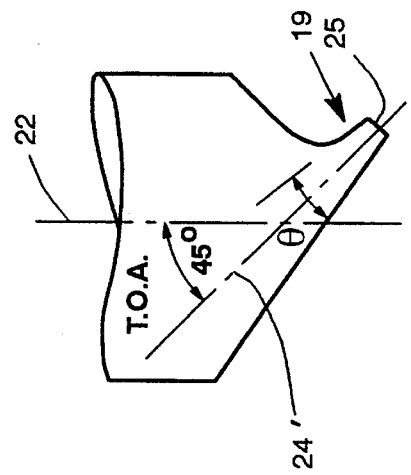
FIG. 8 is an enlarged view of the tip of the offset wedge bonding tool of FIG. 7.

Refer now to FIG. 7 showing a front elevation of a preferred embodiment offset wedge bonding tool 17 and to FIG. 8 showing an enlarged view of the tip or tapered wedge end 19 of the bonding tool of FIG. 7. The axis 22 of the body 18 of the bonding tool 17 is shown in a vertical position and the working face 25 of the tapered wedge 19 is shown inclined at an angle of 45 degrees from the axis 22. Thus, when the bonding tool 17 is clamped in an ultrasonic transducer and offset in an angle of 45 degrees, the working face 25 of the bonding tool 17 will be in a horizontal plane for performing a bonding operation. The tapered wedge 19 is shown having a working face 25 which is horizontal and with an axis 24' having an included angle theta which is inclined at 45 degrees from the axis 22. As explained hereinbefore, it is not necessary that the taper 19 be symmetrical to any axis 24'.

Figure 9:
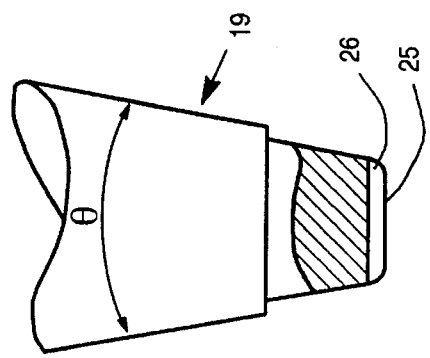
FIG. 9 is a greatly enlarged partial section view of the tip of the offset wedge bonding tool of FIG. 8 showing a single groove in the working face.

Refer now to FIG. 9 which is a greatly enlarged partial section view of the tip of the wedge 19 of the bonding tool shown in FIG. 8. A single groove 26 is shown formed in the working face 25 which is preferably employed to grip the conductive wire being bonded to a bonding target.

Figure 10:
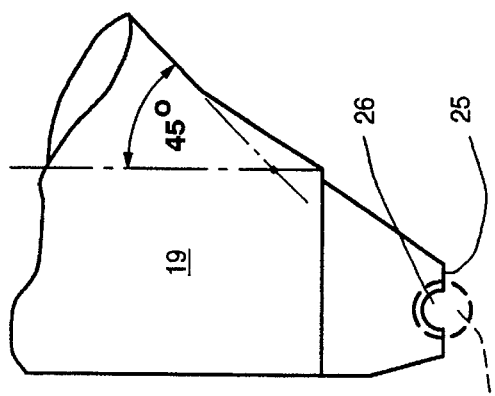
FIG. 10 is a side elevation of tip of the offset wedge bonding tool shown in FIG. 9.

Refer to FIG. 10 which is a side elevation of the tip of the bonding tool shown in FIG. 9. The groove 26 in the working face 25 preferably has a concave shape which is smaller than the wire 14 to be bonded to the target 13. Thus, the bonding tool mashes out all of the insulation on the wire 14 while mashing and bonding the wire 14 to the bonding target 13.

Figure 11:
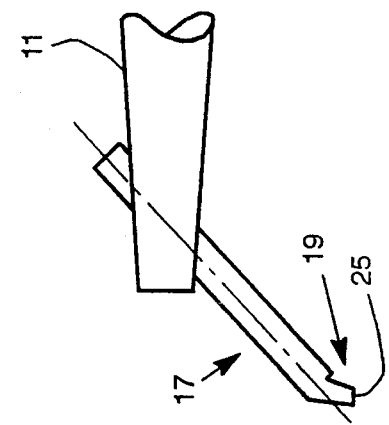
FIG. 11 is a side elevation of a modified offset wedge bonding tool which extends forward from under the transducer.

Refer now to FIG. 11 showing a side elevation of a modified ultrasonic transducer 11 which is adapted to receive the novel wedge bonding tool described hereinbefore with reference to FIGS. 3, 5 and 7 to 10. In this embodiment the working face 25 of the bonding tool 17 extends forward and out from under the ultrasonic transducer 11 so that the scrubbing action of the bonding tool is along the axis of the transducer 11. Thus, the groove 26 would be replaced by a cross-groove or a groove formed orthogonal to the direction of scrub of the tapered wedge 19 on the end of the bonding tool 17.

Figure 12:
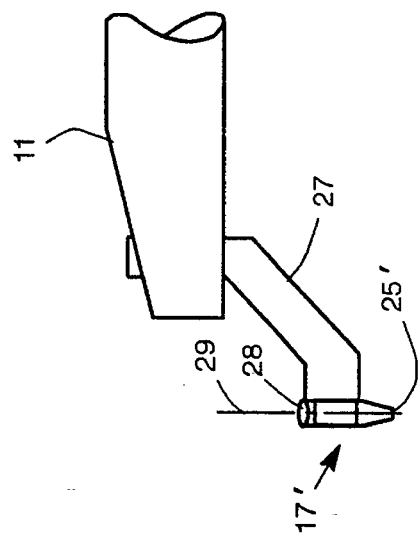
FIG. 12 is a side elevation of an offset capillary bonding tool holder which is capable of extending from under the transducer either laterally and/or forward.

Refer now to FIG. 12 showing a side elevation of a bonding tool holder 27 mounted in an ultrasonic transducer 11 and supporting at its working end a bonding wedge having a working face 25' which is orthogonal to a vertical axis. While the preferred embodiment of the present invention contemplates the use of a wedge bonding tool of the type shown in FIGS. 7 through 11 it is possible to mount a capillary bonding tool 17' in the bonding tool holder 27 so that the working face 25 of the bonding tool 17' is out from under the ultrasonic transducer 11. In this modified embodiment it is possible for the pattern recognition system to be focused at the working face 25 and the bonding pad or bonding target 13 to enhance the speed of operation of a automatic ball bonder employing the same principles of operation of the offset bonding tool wedge explained hereinbefore.

Having explained a preferred embodiment of the present invention and modifications thereof, it will be appreciated that the offset bonding tool described hereinbefore serves two purposes, both of which enhance the speed of operation of automatic wire bonders. In the first instance, the offset bonding wedge permits an epoxy dispenser to operate near simultaneously to perform a second operation at the same bonding station without moving the substrate. Further, since the view of the tip of the bonding wedge 17 is out from under the ultrasonic transducer 11 it is possible to continuously perform pattern recognition of the adjacent bonding targets 13 while simultaneously performing bonding operations. Thus, this latter feature may be employed with capillary bonding tools which have annular working faces at the tip of the bonding tool 17'.

While the dispensers 15 have been shown mounted in a vertical axis adjacent the bonding wedge or bonding capillary 17, it is possible to dispense the adhesive from a dispenser 15 or a tube which performs the same operation as the dispenser 15 and is inclined so as not to obscure the field of view of a pattern recognition system (PRS).

We claim:

1. An offset wedge bonding tool for mounting in an ultrasonic transducer having a horizontal axis and for bonding an electrical conductor to a bonding target, said offset wedge comprising:

an elongated body having a clamping end and a bonding end on the end opposite the clamping end, said elongated body having a body axis when operable for bonding which is substantially inclined from a vertical axis and orthogonal to the axis of said transducer, said bonding end comprising a tapered wedge having a wedge axis when operable for bonding which is nearly vertical and is inclined from a vertical axis from zero up to fifteen degrees, said tapered wedge further comprising a flat area working face at the bonding end of the tapered wedge wherein said flat area is orthogonal to a vertical axis, said flat area working face of said tapered wedge of said bonding tool having recessed gripping means on the end of the tapered wedge for swaging and bonding said conductor, and said working face of said tapered wedge of said bonding tool being offset vertically from under the clamping end of said elongated body and to a side of the axis of the ultrasonic transducer to provide vertical access to the bonding area adjacent to the working face of said bonding tool.

2. An offset wedge bonding tool as set forth in claim 1 wherein said recessed gripping means comprises a groove having a groove radius that is less than fifty percent of the radius of a wire to be bonded.

3. An offset wedge bonding tool as set forth in claim 1, which further includes, an ultrasonic transducer for holding said elongated body at an angle of about forty-five degrees ± about fifteen degrees and for moving said wedge axis orthogonal to the axis of said ultrasonic transducer.

4. An offset wedge bonding tool as set forth in claim 3 wherein the working face on said tapered wedge is extended sideways from underneath said ultrasonic transducer to permit access to the bonding area adjacent to said working face.

5. An offset wedge bonding tool as set forth in claim 3 which further includes, a liquid adhesive dispenser positioned adjacent to and apart from said tapered wedge on said bonding tool, for simultaneously applying adhesive to the electrical conductor being bonded by said offset bonding tool.

6. An offset wedge bonding tool for mounting in an ultrasonic transducer of the type having a horizontal axis for bonding an electrical conductor to a bonding target without obscuring sight of the bonding target area, comprising:

an elongated bonding tool having a first end for coupling in said ultrasonic transducer, a tapered bonding wedge on said elongated bonding tool at a second end opposite said first end, said first end of said elongated bonding tool having a first axis when operable for bonding which is both inclined from a vertical axis and orthogonal to the axis of said transducer, said second end of said elongated bonding tool terminated in said tapered bonding wedge having a second axis inclined from said first axis, a flat area working face on said tapered bonding wedge wherein said flat area is orthogonal to a vertical axis, said working face on said tapered bonding wedge on said elongated bonding tool being offset to a side and from under the end of the ultrasonic transducer, and recessed gripping means in said working face extending in a direction orthogonal to said horizontal axis of said transducer.

7. A method of bonding an electrical conductor to a bonding target without obscuring the bonding target area, comprising the steps of:

providing a tapered wedge-shaped bonding tool with a flat area working face on an elongated body, providing an ultrasonic transducer with a horizontal axis, providing a recessed groove in the working face of said bonding tool wherein said groove is orthogonal to said horizontal axis, mounting said tapered shape bonding tool in said ultrasonic transducer so that the elongated body of the bonding tool extends diagonally and orthogonally to the side and from under the end of said ultrasonic transducer so that the bonding target area is not obscured by said ultrasonic transducer during the bonding operation, pressing said recessed groove of said bonding tool over said electrical conductor, and bonding said electrical conductor to said bonding target by ultrasonically moving said electrical conductor relative to said bonding target.

8. The method as set forth in claim 7 which further includes the steps of:

bonding said electrical conductor to said bonding target, and simultaneously applying a liquid adhesive to said electrical conductor adjacent to said bonding tool.

* * * * *